(12) United States Patent
Terrovitis et al.

(10) Patent No.: US 8,884,707 B2
(45) Date of Patent: Nov. 11, 2014

(54) TWO-DELAY VOLTAGE-CONTROLLED-OSCILLATOR WITH WIDE TUNING RANGE

(71) Applicant: QUALCOMM Incorporated, San Diego, CA (US)

(72) Inventors: Emmanouil Terrovitis, Foster City, CA (US); Abbas Komijani, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 13/651,340

(22) Filed: Oct. 12, 2012

(65) Prior Publication Data

US 2014/0002198 A1     Jan. 2, 2014

Related U.S. Application Data (60) Provisional application No. 61/667,082, filed on Jul. 2, 2012.

(51) Int. Cl.
    *H03K 3/03*               (2006.01)

(52) U.S. Cl.
    USPC ............................................. 331/57; 331/111

(58) Field of Classification Search
    USPC .................................................. 331/57, 111
    See application file for complete search history.

(56) References Cited

U.S. PATENT DOCUMENTS

| | | | |
|---|---|---|---|
| 4,236,121 A | * | 11/1980 | Senturia ........................... 331/57 |
| 6,147,566 A | * | 11/2000 | Pizzuto et al. ................. 331/111 |
| 7,113,048 B2 | | 9/2006 | Brown et al. |
| 7,683,726 B2 | | 3/2010 | Kim |
| 7,705,685 B2 | | 4/2010 | Ng et al. |
| 8,207,770 B1 | | 6/2012 | Ravi et al. |
| 2004/0032299 A1 | | 2/2004 | Wang |
| 2008/0084249 A1 | | 4/2008 | Noguchi |

OTHER PUBLICATIONS

International Search Report and Written Opinion—PCT/US2013/046921—ISA/EPO—Dec. 17, 2013.
Partial International Search Report—PCT/US2013/046921—ISA/EPO—Sep. 20, 2013.
Zhao, Junhong, "Design of Low-Phase-Noise and Low-Power Current-Controlled Oscillators," ProQuest Dissertations and Theses (2010) ProQuest Dissertations & Theses: The Sciences and Engineering Collection, pp. 1-83.

* cited by examiner

*Primary Examiner* — Joseph Chang
(74) *Attorney, Agent, or Firm* — Mahamedi Paradice LLP (57) ABSTRACT

An oscillator is disclosed that can generate an oscillation signal using a latch and two delay elements. For some embodiments, the oscillator includes an SR latch, a first delay element, and a second delay element. The SR latch has a first input, a second input, a first output, and a second output. The first delay element is coupled between the first output and the first input of the SR latch. The second delay element is coupled between the second output and the second input of the SR latch. For some embodiments, the first and second delay elements include a programmable pull-up circuit that allows the charging current to be adjusted in discrete amounts, and include a programmable capacitor circuit that allows the capacitance value to be adjusted in discrete amounts.

29 Claims, 9 Drawing Sheets

TWO-DELAY VOLTAGE-CONTROLLED-OSCILLATOR WITH WIDE TUNING RANGE

CROSS-REFERENCE TO RELATED APPLICATIONS

This application claims the benefit under 35 USC 119(e) of the co-pending and commonly owned U.S. Provisional Application No. 61/667,082 entitled "TWO-DELAY VOLTAGE-CONTROLLED-OSCILLATOR WITH WIDE TUNING RANGE" filed on Jul. 2, 2012, the entirety of which is incorporated by reference herein.

TECHNICAL FIELD

The present embodiments relate generally to oscillators, and specifically to voltage-controlled oscillators.

BACKGROUND OF RELATED ART

An oscillator is a circuit that generates an oscillating output signal (e.g., that alternately transitions between logic high and logic low states). Oscillating signals are used in a wide variety of applications including, for example, generating clock signals for controlling the timing of digital circuits and generating carrier signals that can be processed to transmit information (e.g., RF signals). A voltage-controlled oscillator (VCO) is an oscillator having an output signal whose oscillation frequency can be controlled by a voltage signal. For example, varying the DC voltage of the control signal can adjust the oscillation frequency of the VCO's output signal, while modulating the control signal can change the frequency modulation (FM) and/or phase modulation (PM) of the VCO's output signal.

Oscillators are typically categorized into two classes depending upon the waveform of their output signals. Harmonic oscillators generate a sinusoidal waveform, and typically include an amplifier and a resonant feedback circuit. Oscillation occurs at the resonant frequency for which a positive gain arises around the loop. Commonly known harmonic oscillators include crystal oscillators and LC-tank oscillators.

Relaxation oscillators generate a sawtooth or triangular waveform, and are typically implemented in monolithic integrated circuits (ICs) because they can provide a wide range of operational frequencies with a minimal number of external components. Commonly known relaxation oscillators include grounded-capacitor VCOs, emitter-coupled VCOs, and delay-based ring VCOs. For the delay-based ring VCOs, which typically include a number of delay stages arranged in a ring, the output frequency is a function of the delay in each of the gain stages. More specifically, ring oscillators typically include an odd number of delay stages connected in a loop such that the output of the last delay stage is coupled to the input of the first delay stage, thereby causing the output of the last delay stage to toggle or oscillate at a frequency proportional to the number of delay stages and/or the delay period associated with each delay stage.

Although conventional relaxation oscillators can provide oscillating signals, it would be desirable to simplify the architecture of the oscillator and/or to reduce the number and complexity of the oscillator's components.

SUMMARY

A ring oscillator is disclosed that can generate an oscillation signal using only a set-reset (SR) latch and two delay elements. For some embodiments, the oscillator includes an SR latch, a first delay element, and a second delay element. The SR latch has a first input to receive a RESET signal, a second input to receive a SET signal, a Q output, and a $\overline{Q}$ output. The first delay element is coupled between the first output and the first input of the SR latch, and receives a first start signal. The second delay element is coupled between the second output and the second input of the SR latch, and receives a second start signal.

In an exemplary mode of operation, the first start signal is initially in a logic high state, and the second start signal is initially in a logic low state. Upon receiving the logic high first start signal, the first delay element asserts the RESET to logic high after a delay period associated with the first delay element. Assertion of the RESET signal causes SR latch 110 to reset its Q output to logic low and to reset its $\overline{Q}$ output to logic high, thereby also resetting the first start signal to logic low and the second start signal to logic high. In response to the falling edge of the first start signal, the first delay element de-asserts the RESET signal to logic low. In response to the rising edge of the second start signal, the second delay element asserts the SET signal to logic high after a delay period associated with the second delay element. Assertion of the SET signal causes the SR latch to set its Q output to logic high and to set its $\overline{Q}$ output to logic low, thereby generating an oscillation output signal at the Q output of the SR latch.

For some embodiments, the first and second delay elements may include a programmable pull-up circuit that allows the charging current to be adjusted in discrete amounts, and may include a programmable capacitor circuit that allows a capacitance within the delay elements to be adjusted in discrete amounts. The programmable pull-up circuit may include a plurality of individually selectable charging circuits that may be selectively enabled in response to a first set of enable signals to adjust the charging current provided to the capacitance within the delay elements. The programmable capacitor circuit may include a plurality of individually selectable capacitor circuits that may be selectively enabled in response to a second set of enable signals to adjust the capacitance value. For such embodiments, the first and second sets of enable signals may be generated by a state machine that can select between a lower power mode and a low noise mode.

BRIEF DESCRIPTION OF THE DRAWINGS

The present embodiments are illustrated by way of example and are not intended to be limited by the figures of the accompanying drawings, where.

Like reference numerals refer to corresponding parts throughout the drawing figures.

DETAILED DESCRIPTION

In the following description, numerous specific details are set forth to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

Figure 1A:
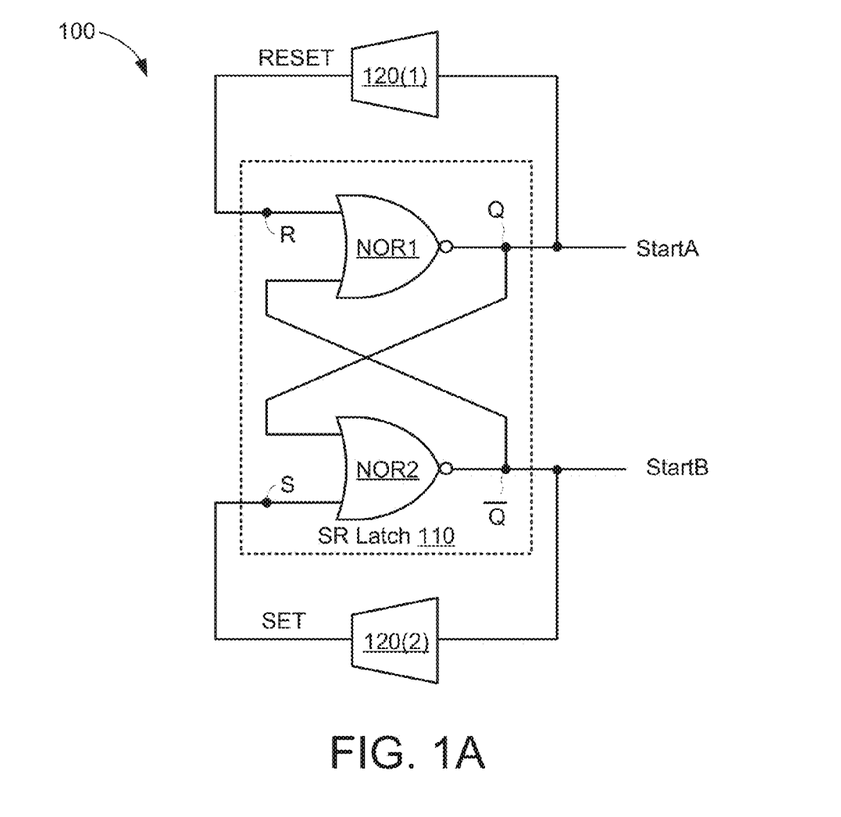
FIG. 1A is a block diagram of an oscillator in accordance with the present embodiments.

FIG. 1 is a block diagram of a ring oscillator 100 in accordance with at least one embodiment. Oscillator 100 includes a set-reset (SR) latch 110 and two delay elements 120(1) and 120(2). The SR latch 110, which is formed by two cross-coupled NOR gates NOR1 and NOR2, includes a Reset input (R), a Set input (S), a first output (Q) to generate an oscillation output signal, and a second output ($\overline{Q}$) to generate a complementary oscillation output signal. The first delay element 120(1) has an input coupled to the Q output of SR latch 110, and has an output coupled to the Reset input of SR latch 110. The second delay element 120(2) has an input coupled to the $\overline{Q}$ output of SR latch 110, and has an output coupled to the Set input of SR latch 110. In this manner, first delay element 120(1) provides the RESET signal for SR latch 110, and second delay element 120(2) provides the SET signal for SR latch 110. Thus, for some embodiments, assertion of the RESET signal (e.g., to logic high) by first delay element 120(1) causes SR latch 110 to drive its Q output to logic low and drive its $\overline{Q}$ output to logic high, while assertion of the SET signal (e.g., to logic high) by second delay element 120(2) causes SR latch 110 to drive its Q output to logic high and drive its $\overline{Q}$ output to logic low.

The resulting logic state of the Q output drives the input of first delay element 120(1), and the resulting logic state of the $\overline{Q}$ output drives the input of first delay element 120(2). As a result, a logical transition edge (e.g., a positive edge) may circulate through delay elements 120(1)-120(2) and SR latch 110 to cause the oscillation output signal to oscillate between logic low and logic high states. The oscillation frequency of the output signal may be determined, at least in part, by the signal delay introduced by first and second delay elements 120(1) and 120(2).

Further, the input of first delay element 120(1) is associated with a first start signal (StartA), and the input of second delay element 120(2) is associated with a second start signal (StartB). Together, the initial logic states of signals StartA and StartB may define one of four possible start conditions for oscillator 100, as summarized below in Table 1:

TABLE 1

| Condition | StartA | StartB | Operation |
|---|---|---|---|
| 1 | 0 | 0 | race |
| 2 | 0 | 1 | normal |
| 3 | 1 | 0 | normal |
| 4 | 1 | 1 | race |

For some embodiments, each of delay elements 120(1) and 120(2) may be configured to propagate low-to-high transitions (or a positive edge) from its input terminal to its output terminal after an externally-adjustable predetermined delay period indicative of the frequency of the oscillation signal, and may be configured to propagate high-to-low transitions (or a negative edge) from its input terminal to its output terminal after a small gate delay that may have a negligible effect upon the oscillation frequency. In this manner, oscillator 100 may be configured to propagate a positive or rising edge of the start signal through SR latch 110 and delay elements 120(1)-120(2) in a manner that produces an oscillation signal at the Q output of SR latch 110 (and thereby producing a complementary oscillation signal at the $\overline{Q}$ output of SR latch 110.

Figure 1B:
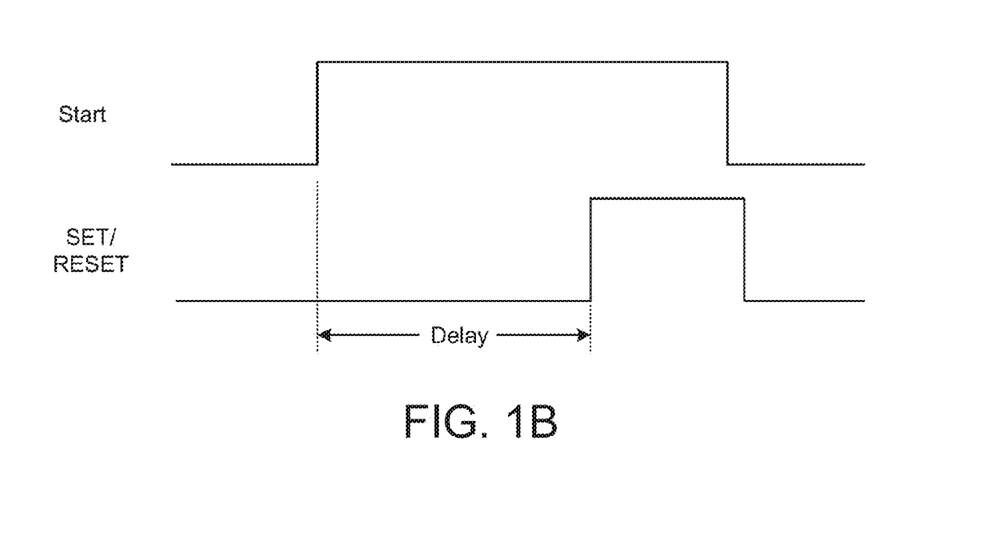
FIG. 1B is a waveform diagram depicting an exemplary delay provided by the delay elements of FIG. 1A.

More specifically, referring also to FIG. 1B, in response to receiving a rising edge of signal StartA, first delay element 120(1) asserts its output signal RESET to logic high after a predetermined delay period D1 associated with first delay element 120(1). Similarly, in response to receiving a rising edge of signal StartB, second delay element 120(2) asserts its output signal SET to logic high after a predetermined delay period D2 associated with second delay element 120(2). For one or more embodiments, upon receiving a falling edge of signal StartA, first delay element 120(1) quickly de-asserts its output signal RESET to logic low (e.g., more quickly than asserting output signal RESET to logic high in response to a rising edge of StartA), and upon receiving a falling edge of signal StartB, second delay element 120(2) quickly de-asserts its output signal SET to logic low (e.g., more quickly than asserting output signal SET to logic high in response to a rising edge of StartB).

Figure 2A:
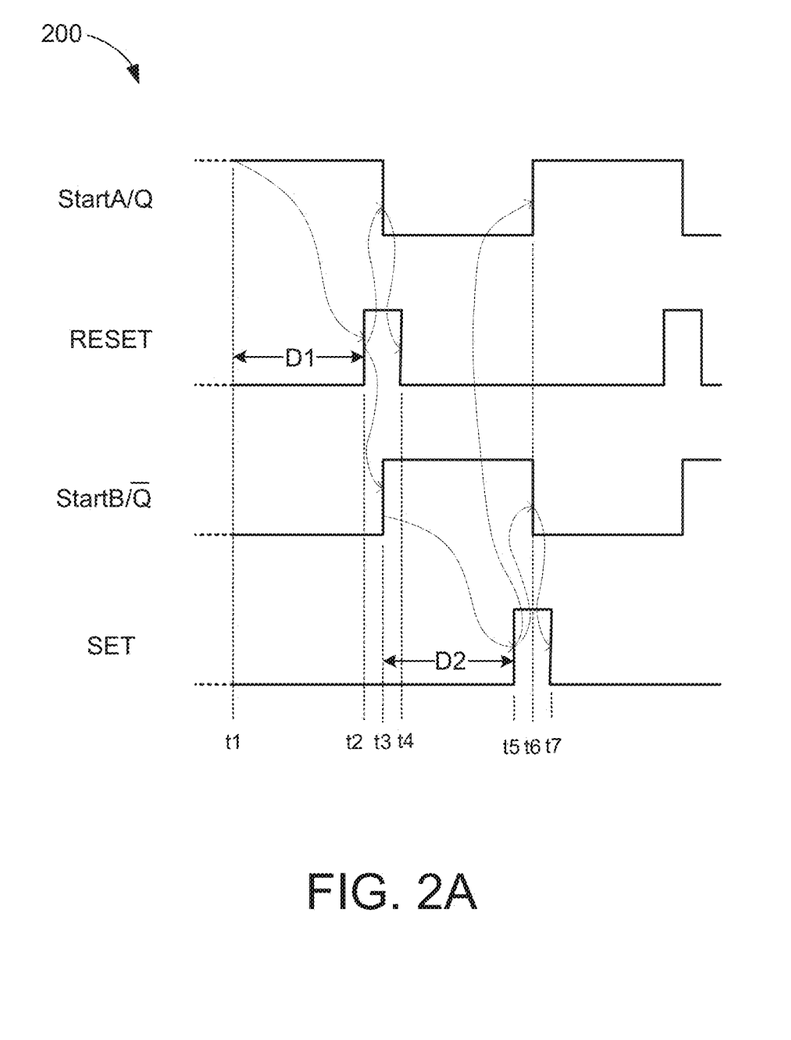
FIG. 2A is an illustrative timing diagram depicting an exemplary operation of some embodiments of the oscillator of FIG. 1A.
Figure 2B:
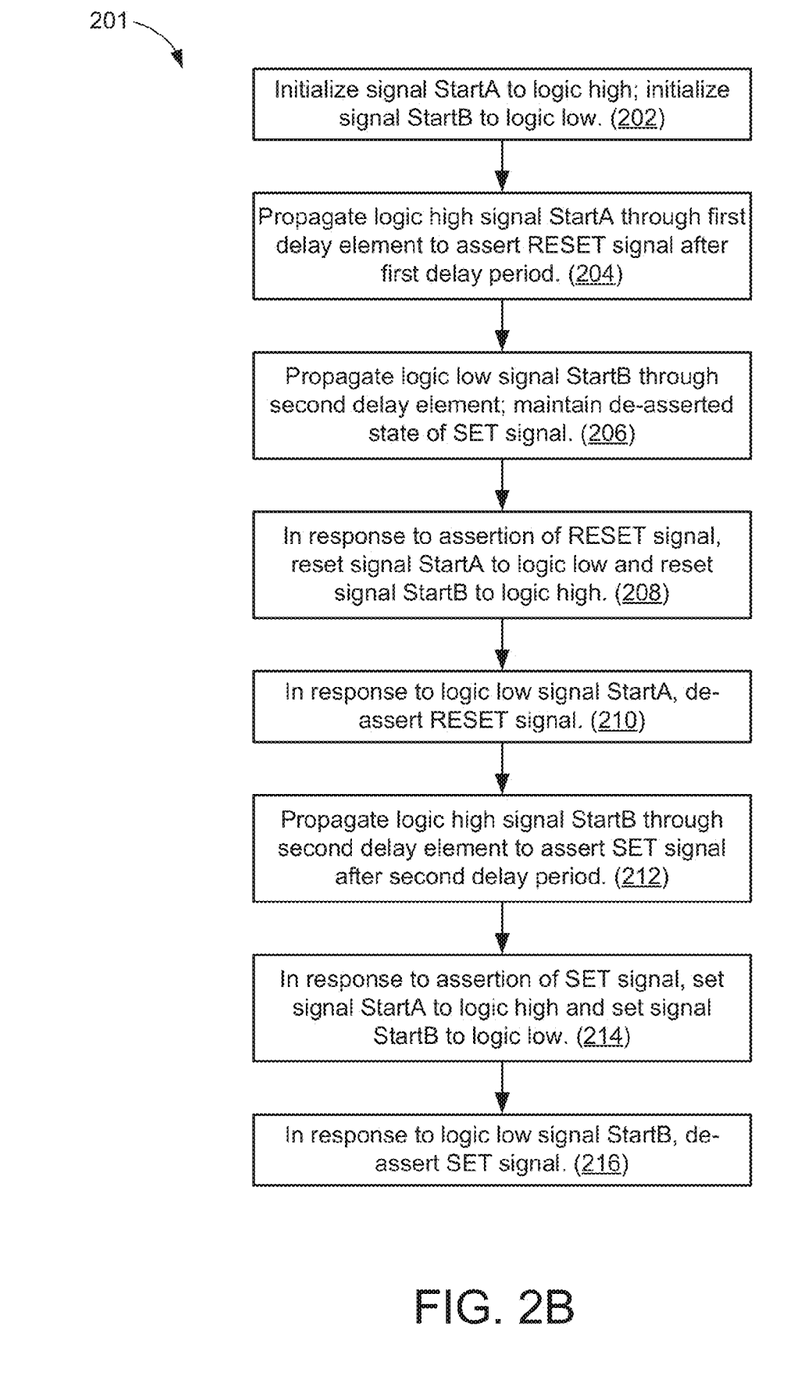
FIG. 2B is an illustrative flow chart of the exemplary operation of the oscillator of FIG. 1A as depicted in the timing diagram of FIG. 2A.

An exemplary operation of oscillator 100 is described below with respect to the illustrative timing diagram 200 of FIG. 2A and the illustrative flow chart 201 of FIG. 2B for the initial condition #3 of Table 1 in which StartA is initially logic high and StartB is initially logic low. More specifically, for the exemplary embodiment described herein with respect to the illustrative timing diagram of FIG. 2A, at time t1, signal StartA is in a logic high state, and signal StartB is in a logic low state (202). In response to receiving the logic high state of StartA at time t1, the first delay element 120(1) asserts its output signal RESET to logic high at time t2, wherein the time period between times t1 and t2 is the first delay period D1 associated with the propagation of a low-to-high transition through first delay element 120(1) (204). In response to receiving the logic low state of StartB at time t1, the second delay element 120(2) maintains its output signal SET at logic low (206).

Assertion of the RESET signal to logic high at time t2 causes SR latch 110 to reset its Q output to logic low and to reset its $\overline{Q}$ output to logic high at time t3, thereby transitioning signal StartA from logic high to logic low at time t3 and also transitioning signal StartB from logic low to logic high at time t3 (208).

In response to the falling edge of signal StartA at time t3, first delay element 120(1) transitions its output signal RESET from logic high to logic low at time t4 (210).

In response to the rising edge of signal StartB at time t3, second delay element 120(2) transitions its output signal SET from logic low to logic high at time t5, wherein the time period between times t3 and t5 corresponds to the second delay period D2 associated with the propagation of a logic high signal through second delay element 120(2) (212).

Assertion of the SET signal to logic high at time t5 causes SR latch 110 to set its Q output to logic high and to set its $\overline{Q}$ output to logic low at time t6, thereby transitioning signal StartA from logic low to logic high at time t6 and also transitioning signal StartB from logic high to logic low at time t6 (214).

In response to the falling edge of signal StartB at time t6, second delay element 120(2) transitions its output signal SET from logic high to logic low at time t7 (216).

Thus, after the initial assertion of signal StartA to logic high, oscillator 100 maintains signal startA in the logic high state for a first duration determined by the delay period D1 of first delay element 120(1), and then after assertion of signal StartB (as triggered by assertion of the RESET signal), oscillator 100 maintains signal startB in the logic high state for a second duration determined by the delay period D2 of second delay element 120(2). In this manner, the oscillator 100 alternately sets and resets signals StartA and StartB to complementary logic levels indefinitely, thereby providing complementary oscillation output signals at the Q and $\overline{Q}$ outputs of SR latch 110.

The oscillator 100 of FIG. 1 is advantageous over conventional ring oscillators for several reasons. First, oscillator 100 may generate oscillation output signals using only two delay elements 120(1) and 120(2) (e.g., that introduce a first externally-adjustable predetermined delay period D1 between the Q output and reset input of latch 110 and a second externally-adjustable predetermined delay period D2 between the $\overline{Q}$ output and set input of latch 110, respectively). In contrast, conventional ring oscillators typically require an odd number of delay stages greater than two (e.g., 3 or more) to enable logic state transitions (and thus oscillations) in the output signal. Indeed, providing an even number of delay stages in a conventional ring oscillator may not generate an oscillating output signal because the last signal in the ring would necessarily be of the same logic state as the first signal in the ring, and therefore would not produce any logic state transitions.

Second, if the first delay period D1 provided by the first delay element 120(1) is equal to the second delay period D2 provided by the second delay element 120(2), then oscillator 100 may generate an oscillation output signal having a 50% duty cycle using only two delay elements 120(1)-120(2). Conversely, by adjusting the relative delay period D1 with respect to delay period D2, a desirable duty cycle different than 50% can be achieved, which might be desirable for some applications. In contrast, the ring oscillator duty cycle is determined by the propagation time of a positive edge through the ring with respect to the propagation time of a negative edge through the ring. Since the rise and fall times of the delay cells of the ring generally are different, the duty cycle is usually close to, but not exactly, 50%. In addition, adjusting the duty cycle to a desirable value with good accuracy may not be easily achievable in conventional ring oscillators.

By generating an oscillation output signal using only one SR latch 110 and two delay elements 120(1)-120(2), oscillator 100 of FIG. 1 is smaller and less complex than conventional relaxation oscillators. Indeed, unlike many conventional relaxation oscillators, oscillator 100 of FIG. 1 does not include voltage comparators or RC filters, and does not depend upon the generation of reference voltages or reference currents. Indeed, the simplicity of oscillator 100 may allow it to be implemented using digital circuits (e.g., rather than analog circuits).

In addition, for the oscillator 100 of FIG. 1, a single rising or positive edge propagates through all the circuit elements (e.g., delay elements 120(1)-120(2) and gates NOR1-NOR2) once in each oscillation period, which may be advantageous for some applications. In contrast, conventional ring oscillators typically propagate both a positive edge and a negative edge (e.g., edges that are 180 degrees out of phase with each other) through the ring in each oscillation period.

Referring again to Table 1, if the signals StartA and StartB are initially in logic low and logic high states (e.g., as depicted in condition #2), then oscillator 100 initially behaves in a manner described above with respect to time t4 in FIG. 2A. However, for conditions #1 and #4 in which both signals StartA and StartB are initially in the same logic state, there is a race condition in which one of the two start signals first transitions to another state. More specifically, for condition #4 in which both StartA and StartB are initially logic high, the logic high StartA propagates through first delay element 120(1) while the logic high StartB propagates through second delay element 120(2). If first delay element 120(1) asserts the RESET signal first, then SR latch 110 drives its Q output to logic low and drives its $\overline{Q}$ output to logic high, thereby enabling oscillation to begin with StartA=0 and StartB=1. Conversely, if second delay element 120(2) asserts the SET signal first, then SR latch 110 drives its Q output to logic high and drives its $\overline{Q}$ output to logic low, thereby enabling oscillation to begin with StartA=1 and StartB=0.

For condition #1 in which both StartA and StartB are initially logic low, then the logic low StartA propagates through first delay element 120(1) while the logic low StartB propagates through second delay element 120(2). Because of the minimal delays associated with delay elements 120(1)-120(2) propagating logic low signals, both the RESET and SET signals are driven to logic low at substantially the same time. In this condition, SR latch 110 operates as two cross-coupled inverters and settles to either condition #2 or condition #3.

As mentioned above, for some embodiments, the oscillator 100 of FIG. 1 may be implemented using delay elements 120(1)-120(2) that propagate positive or rising edges more quickly than negative or falling edges. For other embodiments, delay elements 120(1)-120(2) may be configured to propagate positive edges more quickly than negative or falling edges, for example, so that oscillator 100 propagates a single negative edge through circuit elements 110 and 120(1)-120(2) to generate complementary oscillation output signals at terminals Q and $\overline{Q}$. For such other embodiments, NOR gates NOR1 and NOR2 of SR latch 110 may be replaced by NAND gates.

Figure 3:
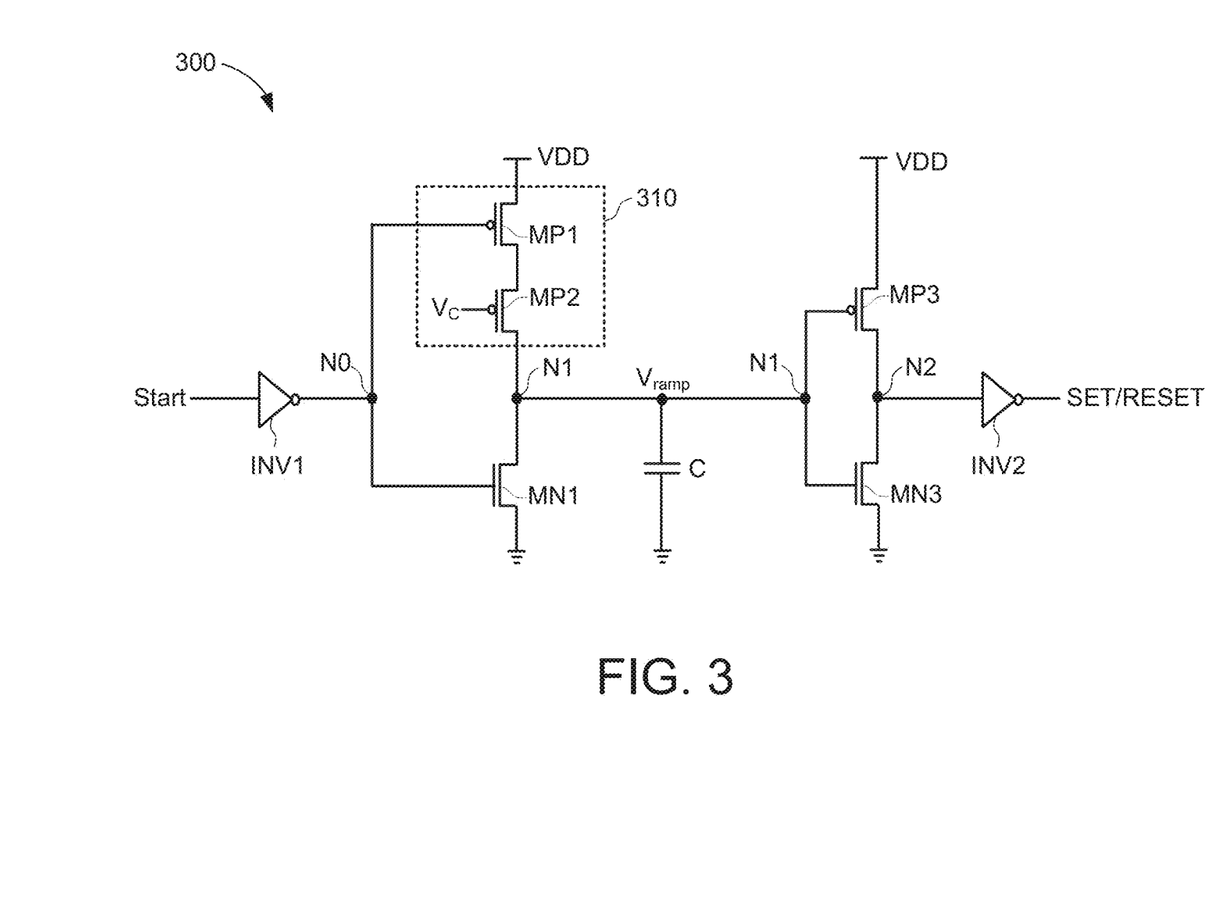
FIG. 3 shows a voltage-controlled delay element that, in accordance with some embodiments, may be used as the delay element(s) in the oscillator of FIG. 1A.

For some embodiments, a voltage-controlled delay element may be used for delay elements 120(1) and 120(2) of oscillator 100, thereby allowing oscillator 100 to operate as a voltage-controlled oscillator (VCO). For example, FIG. 3 shows a delay element 300 that is one embodiment of delay elements 120(1) and/or 120(2) of FIG. 1. Delay element 300 is shown to include CMOS inverters INV1-INV2, PMOS transistors MP1-MP3, NMOS transistors MN1 and MN3, and a capacitor C. INV1 has an input to receive the associated start signal, and has an output coupled to the gates of transistors MP1 and MN1 at node N0. Transistors MP1 and MP2 are coupled in series between VDD and a charging node N1, and pull-down transistor MN1 is coupled between node N1 and ground potential. Transistor MP2 includes a gate to receive a control voltage ($V_C$), and may thus operate together with transistor MP1 as a voltage-controlled current source. Capacitor C is coupled between node N1 and ground potential, where the commonly coupled sources of MP2 and MN1 at node N1 provide a ramp voltage ($V_{ramp}$) to capacitor C. Transistors MP3 and MN3 are coupled in series between VDD and ground potential, and form an inverter having an input at node N1 and an output at node N2. INV2 has an input coupled to node N2 and an output to generate the associated signal SET or RESET.

In operation, transistors MP1-MP2 may act as a weak pull-up circuit 310 that slowly charges capacitor C by developing the ramp voltage $V_{ramp}$ on its top plate, while transistor MN1 may act as a strong pull-down circuit that quickly discharges capacitor C. The control voltage ($V_C$) provided to the gate of transistor MP2 adjusts the charging current for capacitor C, and therefore may adjust the oscillation frequency by adjusting the delay period associated with asserting the SET or RESET signal to logic high in response to positive edge in the start signal.

More specifically, when the input Start signal transitions from logic low to logic high, inverter INV drives N0 low toward ground potential. In response thereto, NMOS transistor MN1 turns off and isolates node N1 from ground potential, and PMOS transistor MP1 turns on. The control voltage $V_C$ is driven to a level that turns on PMOS transistor MP2 (e.g., to a voltage that is less positive than the threshold voltage of MP2), thereby pulling node N1 high towards VDD and charging capacitor C. The speed at which transistor MP2 charges capacitor C may be adjusted by adjusting the control voltage $V_C$. When the voltage at node N1 exceeds the threshold voltage of the CMOS inverter formed by transistors MP3 and MN3, transistor MP3 turns off and transistor MN3 turns on, thereby pulling node N2 low toward ground potential. In response thereto, inverter INV2 asserts the SET or RESET signal to a logic high state.

Thereafter, when the input Start signal transitions from logic high to logic low, inverter INV drives N0 high towards VDD. In response thereto, PMOS transistor MP1 turns off and isolates node N1 from VDD, and NMOS transistor MN1 turns on and quickly discharges node N1 low towards ground potential. Once the voltage at node N1 falls below the threshold voltage of the CMOS inverter formed by transistors MP3 and MN3, transistor MP3 turns on and transistor MN3 turns off, thereby pulling node N2 high towards VDD. In response thereto, inverter INV2 de-asserts the SET or RESET signal to a logic low state.

Note that the exemplary delay element 300 of FIG. 3 is configured to circulate a positive edge when used as delay elements 120(1)-120(2) in oscillator 100. For at least one embodiment in which oscillator 100 may be configured to circulate a negative edge through delay elements 120(1)-120(2) and SR latch 110, delay element 300 may be modified to de-assert the SET or RESET signal in response to a falling edge of the Start signal in a relatively slow manner, and to assert the SET or RESET signal in response to a rising edge of the Start signal in a relatively quick manner.

For one or more alternate embodiments, the delay element 300 of FIG. 3 may be modified so that the capacitor C is coupled between node N1 and VDD, and pull-up circuit 310 is replaced by a pull-down circuit (not shown for simplicity) coupled between node N1 and ground potential. For at least one of the alternate embodiments, the capacitor C may be pre-charged towards VDD and then selectively discharged by the pull-down circuit in response to the control voltage $V_C$. In other embodiments, the pull-up circuit's (or pull-down circuit's) capacitor C can be coupled between node N1 and any direct current (DC) potential, including ground potential (or VDD for the pull-down circuit).

For some applications, it may be desirable to adjust the oscillation frequency in larger discrete steps than allowed by adjusting the control voltage $V_C$. For the delay element 300 of FIG. 3, the oscillation frequency may be adjusted in larger discrete steps by (1) partitioning the pull-up circuit 310 into several individually selectable charging circuits and then selectively enabling one or more of such individually selectable charging circuits (e.g., to incrementally adjust the charging current provided to capacitor C of FIG. 3) and/or by (2) partitioning the capacitor C into several individually selectable capacitor circuits and then selectively enabling one or more of such individually selectable capacitor circuits (e.g., to incrementally adjust the capacitance value of capacitor C of FIG. 3). In this manner, binary weighted partitioning techniques can be used for programming the delay period provided by delay element 300 of FIG. 3, for example, as described in more detail below with respect to FIGS. 4 and 5.

Figure 4:
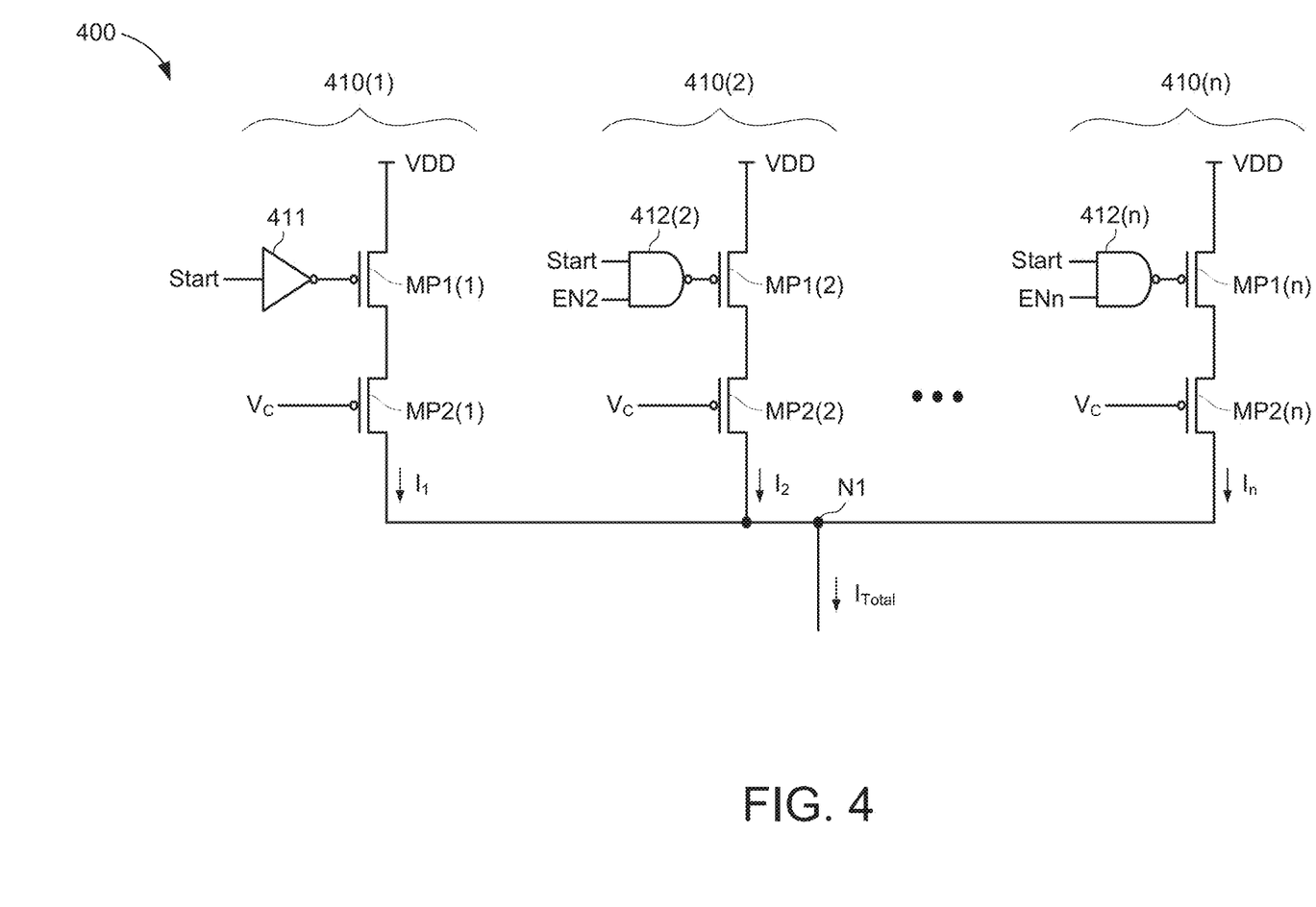
FIG. 4 is a circuit diagram of a programmable pull-up circuit that, in accordance with some embodiments, may be used as the pull-up circuit in the delay element of FIG. 3.

For example, FIG. 4 shows a programmable pull-up circuit 400 that may be used as pull-up circuit 310 of delay element 300 of FIG. 3. Pull-up circuit 400 may include any number n of individually selectable pull-up or charging circuits 410(1)-410(n) coupled in parallel to provide an adjustable charging current $I_{Total}$ for capacitor C of delay element 300 of FIG. 3. As shown in FIG. 4, each of individually selectable charging circuits 410(1)-410(n) includes first and second PMOS transistors MP1(x) and MP2(x) coupled in series between VDD and node N1 to provide a corresponding current $I_1$-$I_n$ that may be used to charge the capacitor C of delay element 300. The gates of first PMOS transistors MP1(1)-MP1(n) are controlled by the Start signal and/or by a corresponding one of enable signals EN2-ENn, and the gates of PMOS transistors MP2(1)-MP2(n) are controlled by the control voltage $V_C$.

For the exemplary embodiment of FIG. 4, the first charging circuit 410(1) is maintained in a conductive state, and the Start signal is provided to its pull-up transistor MP1(1) via inverter 411 so that assertion of the Start signal to logic high turns on transistor MP1(1), and de-assertion of the Start signal to logic low turns off transistor MP1(1). Each of the other individually selectable charging circuits 410(2)-410(n) can be selectively enabled in response to corresponding enable signals EN2-ENn, which are logically combined with the Start signal in corresponding NAND gates 412(2)-412(n). Thus, for example, to enable charging circuit 410(2), EN2 is driven to logic high, which causes NAND gate 412(2) to pass a logical complement of the Start signal to the gate of MP1(2). In this manner, NAND gate 412(2) turns on transistor MP1(2) when the Start signal is logic high and turns off MP1(2) when the Start signal is logic low. Conversely, to disable charging circuit 410(2), EN2 is driven to logic low, thereby forcing the output of NAND gate 412(2) to logic high and maintaining transistor MP1(2) in a non-conductive state.

Accordingly, the amount of current $I_{Total}$ for charging capacitor C may be increased in discrete amounts by enabling a greater number of the charging circuits 410(1)-410(n), and the amount of current $I_{Total}$ for charging capacitor C may be decreased in discrete amounts by enabling a fewer number of the charging circuits 410(1)-410(n).

For the exemplary embodiment of FIG. 4, each of charging circuits 410(1)-410(n) is shown to receive the same control voltage signal $V_C$. For other embodiments, each of charging circuits 410(1)-410(n) may receive its own control voltage, thereby allowing for additional adjustments to the total current $I_{Total}$ provided by circuit 400 for charging capacitor C of FIG. 3.

Figure 5:
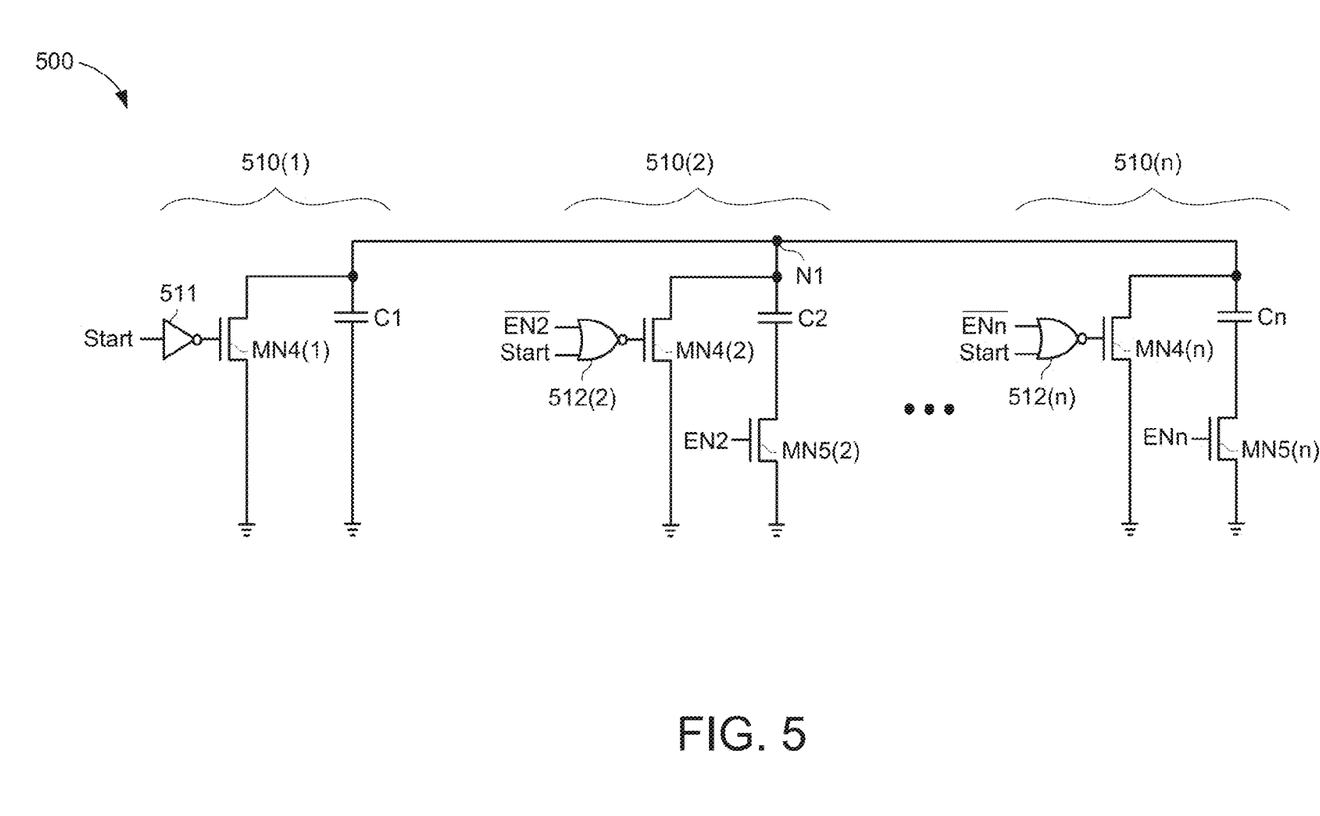
FIG. 5 is a circuit diagram of a programmable capacitor circuit that, in accordance with some embodiments, may be used as the capacitor of the delay element of FIG. 3.

FIG. 5 shows a programmable capacitor circuit 500 that can be used as capacitor C in the delay element 300 of FIG. 3. Capacitor circuit 500 may include any number n of individually selectable capacitor circuits 510(1)-510(n) coupled in parallel to provide an adjustable capacitor C for delay element 300 of FIG. 3. As shown in FIG. 5, the first capacitor circuit 510(1) includes a capacitor C1 coupled between node N1 and ground potential. The other capacitor circuits 510(2)-510(n) include respective capacitors C2-Cn that can be selectively coupled between node N1 and ground potential in response to enable signals EN2-ENn, respectively, as depicted in FIG. 5.

More specifically, the first capacitor circuit 510(1) includes capacitor C1 coupled between node N1 and ground potential, and includes an NMOS by-pass transistor MN4(1) coupled in parallel with capacitor C1 (i.e., also coupled between node N1 and ground potential). The gate of transistor MN4(1) receives the Start signal via inverter 511. Thus, first capacitor circuit 510(1) is maintained in an enabled state in which the logic state of the Start signal controls whether node N1 is shorted to ground potential via transistor MN4(1). For example, when the Start signal is asserted to logic high, inverter 511 drives the gate of transistor MN4(1) to logic low, thereby turning off transistor MN4(1) to allow capacitor C1 to be charged towards VDD (e.g., by pull-up circuit 310 of FIG. 3). Conversely, when the Start signal is de-asserted to logic low, inverter 511 drives the gate of transistor MN4(1) to logic high, thereby turning on transistor MN4(1) and quickly discharging node N1 low towards ground potential.

Each of the other individually selectable capacitor circuits 510(2)-510(n) can be selectively enabled in response to corresponding enable signals EN2-ENn. For each of capacitor circuits 510(2)-510(n), the corresponding enable signal is provided to the gate of an NMOS isolation transistor MN5, and the complement of the corresponding enable signal is logically combined with the Start signal via a NOR gate 512 to control the gate of a corresponding bypass transistor MN4. For example, second capacitor circuit 510(2) includes capacitor C2 and NMOS transistor MN5(2) coupled in series between node N1 and ground potential, and includes an NMOS by-pass transistor MN4(2) coupled in parallel with capacitor C2. The gate of transistor MN5(2) receives the corresponding enable signal EN2, and the gate of transistor MN4(2) receives a logical combination of the Start signal and $\overline{EN2}$ via NOR gate 512(2).

In operation, capacitor circuit 510(2) may be enabled by asserting EN2 to logic high, which turns on transistor MN5(2) and allows the Start signal to control the gate of bypass transistor MN4(2). More specifically, when capacitor circuit 510(2) is enabled, assertion of the Start signal to logic high drives the gate of transistor MN4(2) to logic low via NOR gate 512(2), thereby maintaining transistor MN4(2) in a non-conductive state to allow capacitor C2 to be charged high towards VDD (e.g., by pull-up circuit 300 of FIG. 3). Conversely, de-assertion of the Start signal to logic low drives the gate of transistor MN4(2) to logic high via NOR gate 512(2), thereby turning transistor MN4(2) on and discharging node N1 low towards ground potential via transistor MN4(1).

To disable capacitor circuit 510(2), EN2 may be de-asserted to logic low, which turns off transistor MN5(2) to isolate capacitor C2 from ground potential. The resulting logic high state of $\overline{EN2}$ forces the gate of transistor MN4(2) to logic low, thereby maintaining transistor MN4(2) in a non-conductive state to prevent a short circuit to ground potential.

Accordingly, the amount of capacitance between node N1 and ground potential in programmable capacitor circuit 500 may be increased by enabling a greater number of the individually selectable capacitor circuits 510(2)-510(n), and may be decreased by enabling a fewer number of the individually selectable capacitor circuits 510(2)-510(n). In this manner, the time required to charge the total capacitance value C of circuit 500, and thus the magnitude of the delay period associated with delay element 300 of FIG. 3, may be dynamically adjusted using the enable signals EN2-ENn.

As described above, the programmability functions provided by the programmable pull-up circuit 400 of FIG. 4 and/or the programmable capacitor circuit 500 of FIG. 5 may allow delay element 300 of FIG. 3 to provide both large and small adjustment amounts to the delay period associated with delay element 300. Thus, the amount of delay period provided by delay element 300 may be changed by adjusting the amount of charging current (e.g., using programmable pull-up circuit 400 of FIG. 4), by adjusting the capacitance of the charging capacitor (e.g., using programmable capacitor circuit 500 of FIG. 5), or by adjusting both. As described above, the charging currents provided by embodiments of FIG. 4 and the capacitance value provided by embodiments of FIG. 5 may be adjusted using the enable signal EN2-ENn.

Further, note that FIGS. 4 and 5 depict programmable pull-up circuit 400 and programmable capacitor circuit 500 receive the same set of enable signals. However, for other embodiments, the set of enable signals that control programmable pull-up circuit 400 of FIG. 4 may be different from the set of enable signals that control programmable capacitor circuit 500 of FIG. 5.

Figure 6:
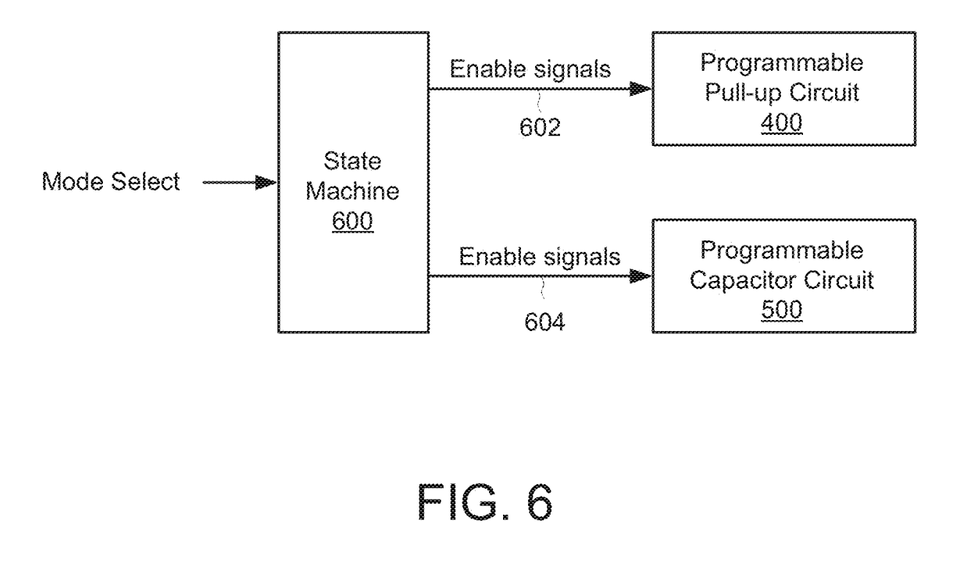
FIG. 6 shows a state machine providing enable signals to the programmable pull-up circuit of FIG. 4 and to the programmable capacitor circuit of FIG. 5 in accordance with some embodiments.

Referring now to FIG. 6, for some embodiments, oscillator 100 may be associated with a state machine 600 that controls generation of the enable signals EN2-ENn for programmable pull-up circuit 400 of FIG. 4 and/or for programmable capacitor circuit 500 of FIG. 5. More specifically, state machine 600 provides a first set of enable signals to programmable pull-up circuit 400 via first signal lines 602, and provides a second set of enable signals to programmable capacitor circuit 500 via second signal lines 604. Thus, for some embodiments, the state machine 600 may provide a first set of enable signals to programmable pull-up circuit 400, and provide a second set of enable signals to programmable capacitor circuit 500. For other embodiments, the set enable signals may be provided to both programmable pull-up circuit 400 and programmable capacitor circuit 500.

The state machine 600, which can be any suitable state machine, logic circuit, processor, or the like, may achieve a desired oscillation frequency for oscillator 100 of FIG. 1 using a number of different combinations of charging current values and capacitance values. In this manner, the state machine 600 may select a desired oscillation frequency for oscillator 100 and then dynamically adjust the operating characteristics of oscillator 100 in response to changing environmental conditions and/or to favor some operating characteristics over others. For example, selecting a lower capacitance value and a lower charging current may reduce power consumption but increase noise, while selecting a higher capacitance value and a higher charging current may reduce noise but increase power consumption. In this manner, the state machine 600 may be configured to support a low power mode and a low noise mode, for example, embodied in one or more mode select signals provided as control signals to state machine 600.

Figure 7:
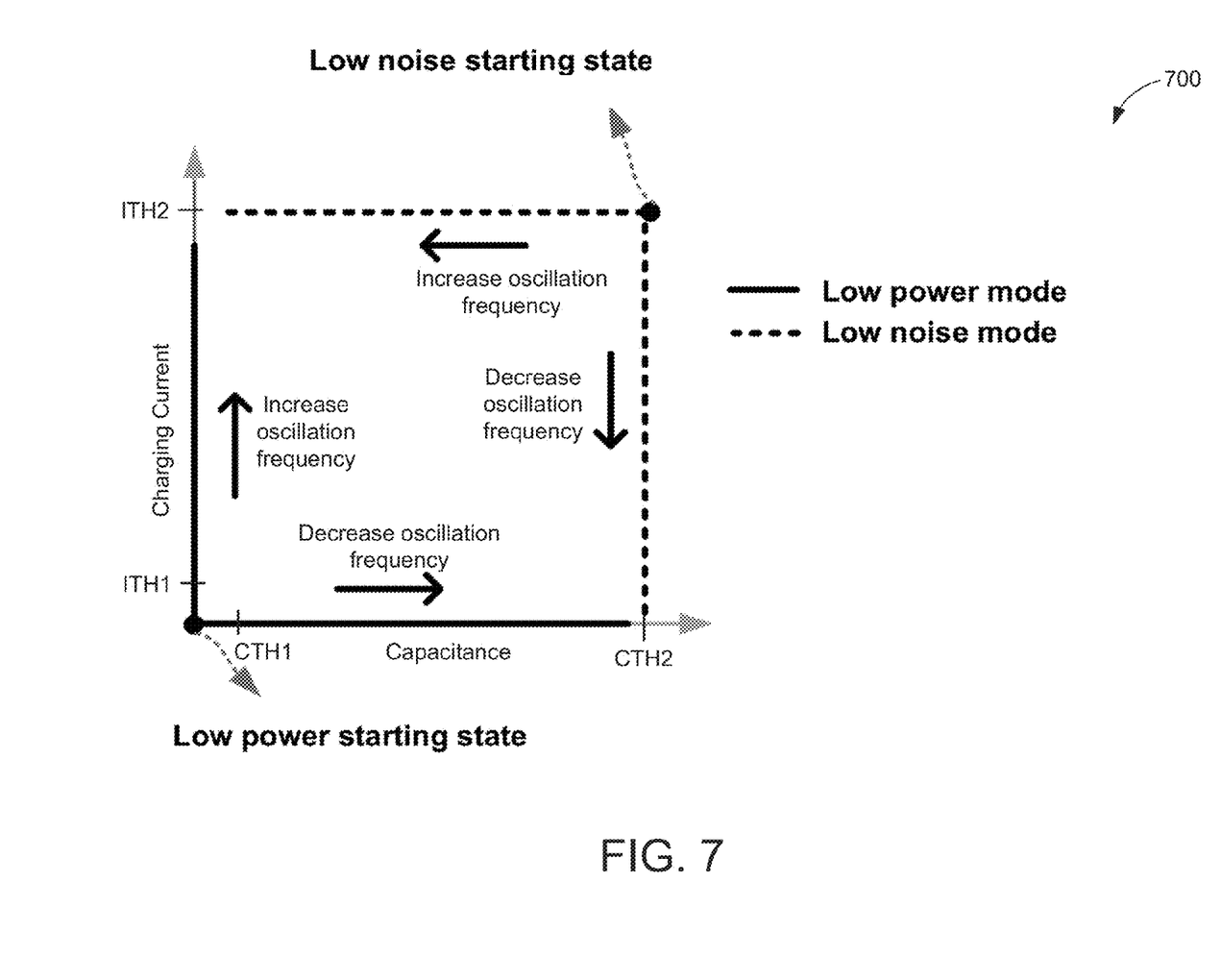
FIG. 7 depicts a state diagram for some embodiments.

More specifically, as depicted in FIG. 7, state machine 600 in the low power mode may achieve the desired oscillation frequency using a low current setting that results in a small charging current (e.g., less than a first current threshold ITH1) provided to capacitor C. For the low power mode, state machine 600 may reduce the capacitance of capacitor C to increase the oscillation frequency. If a low capacitance setting has already been selected (e.g., by enabling only one of the individually selectable capacitor circuits 510 of FIG. 5 such that the capacitance of capacitor C may not be further reduced below a first capacitance threshold CTH1), then the state machine 600 may increase the charging current provided to the capacitor C to increase the oscillation frequency (e.g., by enabling more than one of the individually selectable charging circuits 410 of FIG. 4). Additionally, the state machine 600 may reduce the charging current provided to the capacitor C to decrease the oscillation frequency (e.g., by enabling a fewer number of the individually selectable charging circuits 410 of FIG. 4). If it is desired to further decrease the oscillation frequency, then the state machine 600 may increase the capacitance of capacitor C to decrease the oscillation frequency (e.g., by enabling a greater number of the individually selectable capacitor circuits 510 of FIG. 5).

Operation of the present embodiments during the low noise mode is reversed, as compared to operation during the low power mode. For example, the state machine 600 may increase the charging current to increase the oscillation frequency (e.g., by enabling a greater number of the individually selectable charging circuits 410 of FIG. 4). As depicted in FIG. 7, if a high current setting that results in a large charging current (e.g., greater than a second current threshold ITH2) provided to capacitor C has already been selected, then the state machine 600 may reduce the capacitance of the capacitor C to increase the oscillation frequency (e.g., by enabling a fewer number of the individually selectable capacitor circuits 510 of FIG. 5). Conversely, the state machine 600 may increase the capacitance of the capacitor C to decrease the oscillation frequency (e.g., by enabling a greater number of the individually selectable capacitor circuits 510 of FIG. 5). If it is desired to further decrease the oscillation frequency and the capacitance of capacitor C may not be further increased above a second capacitive threshold CTH2, then the state machine 600 may reduce the charging current to decrease the oscillation frequency (e.g., by enabling a fewer number of the individually selectable charging circuits 410 of FIG. 4).

Figure 8:
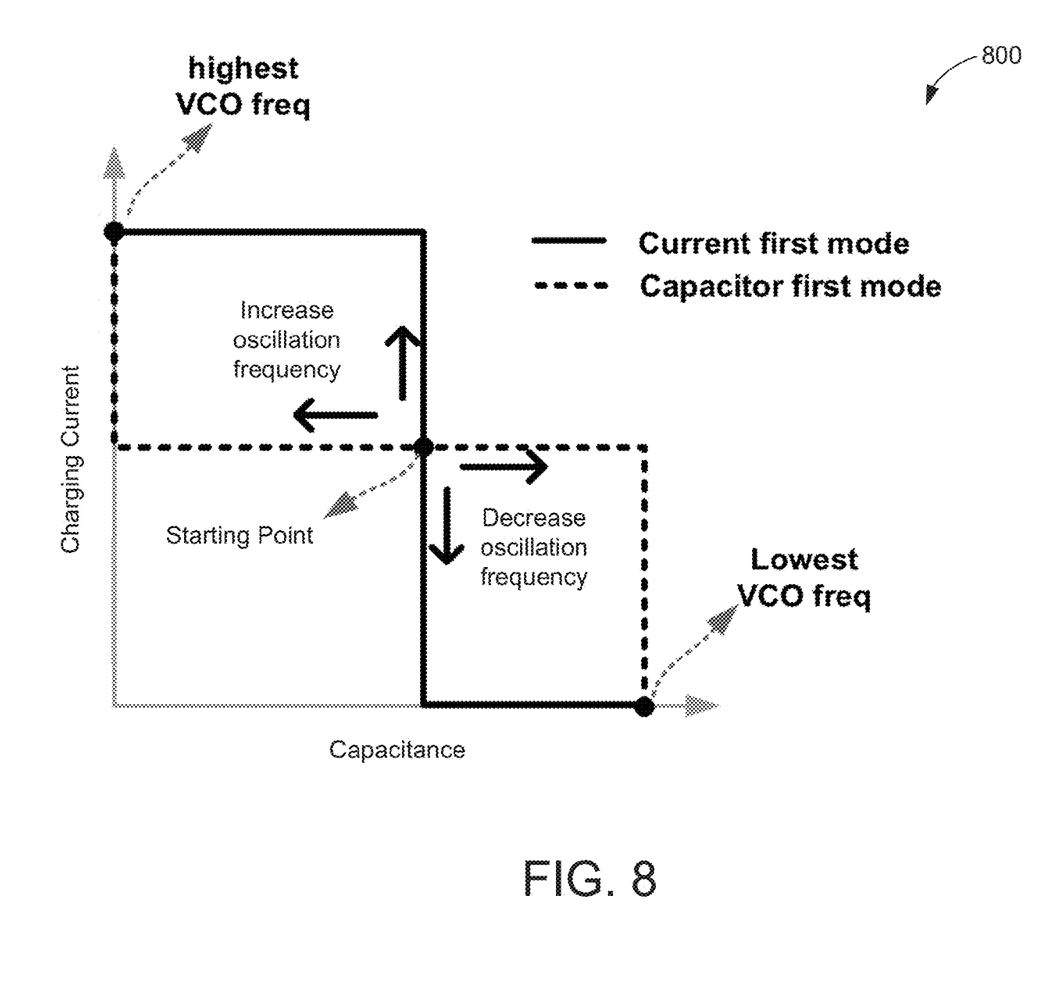
FIG. 8 depicts a state diagram for other embodiments.

As shown in FIG. 8, the initial condition for which the state machine 600 starts may be adjusted according to whether the low power mode or the low noise mode is desired. For the low power mode, the state machine 600 may commerce operation by selecting a minimum capacitance for capacitor C and a minimum charging current; for the low noise mode, the state machine 600 may commerce operation by selecting a maximum charging current and a maximum capacitance for capacitor C.

For some applications, it may be desirable to achieve a trade-off between low noise and low power performance, in which case oscillator 100 may not operate close to the lowest/highest possible current and capacitor settings. For such applications, the oscillator 100 may start at a current/capacitor setting that is configured for typical operating conditions (e.g., for a typical temperature and process corner), as depicted in FIG. 8. Here, the state machine 600 may change the capacitor and current settings when the control voltage $V_C$ drifts outside an acceptable window. To ensure the oscillator 100 returns to the same nominal current and capacitor settings after a temperature cycle, the state machine 600 may adjust only one of the capacitor and current settings, independently of whether the oscillator 100 runs too fast or too slow. These two options are depicted in FIG. 8 as the two trajectories labeled capacitor-first or current-first.

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. An oscillator for generating an oscillation signal, the oscillator comprising:
   a latch including a reset input, a set input, a first output to generate the oscillation signal, and a second output to generate a complementary oscillation signal;
   a first delay element including an input coupled to the first output of the latch, and including an output coupled to the reset input of the latch; and
   a second delay element including an input coupled to the second output of the latch, and including an output coupled to the set input of the latch, wherein the first delay element is associated with a first start signal and provides a first externally adjustable delay period proportional, at least in part, to a first control voltage, and wherein the second delay element is associated with a second start signal and provides a second externally adjustable delay period proportional, at least in part, to a second control voltage.

2. The oscillator of claim 1, wherein the first delay element comprises:
   a pull-up circuit coupled between a supply voltage and a first node, the pull-up circuit responsive, at least in part, to the first start signal;
   a pull-down transistor coupled between the first node and a ground potential, the pull-down transistor responsive to the first start signal;
   a capacitor coupled between the first node and a direct current (DC) potential, the capacitor responsive to a current provided by the pull-up circuit to generate a ramp voltage on the first node; and
   an inverter, coupled between the first node and an output node, to generate the reset signal.

3. The oscillator of claim 2, wherein the pull-up circuit is also responsive to the first control voltage.

4. The oscillator of claim 2, wherein the pull-up circuit is to adjust a charging current provided to the capacitor in response to one or more enable signals.

5. The oscillator of claim 4, wherein the pull-up circuit comprises a plurality of individually selectable charging circuits, at least one of which includes:
   first and second PMOS transistors coupled in series between the supply voltage and the first node, wherein the first PMOS transistor includes a gate to selectively receive the first start signal in response to a corresponding enable signal, and wherein the second PMOS transistor includes a gate to receive the first control voltage.

6. The oscillator of claim 5, wherein the first PMOS transistor is to turn on and charge the capacitor in response to the corresponding enable signal being asserted, and wherein the first PMOS transistor is to turn off and not charge the capacitor in response to the corresponding enable signal being de-asserted.

7. The oscillator of claim 2, wherein the capacitor is to adjust its capacitance in response to one or more enable signals.

8. The oscillator of claim 7, wherein the capacitor comprises a plurality of individually selectable capacitor circuits, at least one of which includes:
a capacitive element and a switch coupled in series between the first node and the DC potential, wherein the switch includes a gate responsive to a corresponding enable signal.

9. The oscillator of claim 8, wherein the individually selectable capacitor circuit further comprises:
a bypass coupled between the first node and the DC potential, and including a gate responsive to a logical combination of the first start signal and the corresponding enable signal.

10. The oscillator of claim 1, wherein each of the delay elements comprises:
a configurable charging circuit to adjust a charging current provided to a charging node in response to one or more first enable signals; and
a configurable capacitor to adjust a capacitance coupled to the charging node in response to one or more second enable signals.

11. The oscillator of claim 10, wherein:
the configurable charging circuit comprises a plurality of charging circuits coupled in parallel between a supply voltage and the charging node, wherein a number of the charging circuits are selectively enabled in response to the first enable signals; and
the configurable capacitor comprises a plurality of capacitor circuits coupled in parallel between the charging node and a direct current (DC) potential, wherein a number of the capacitor circuits are responsive to the second enable signals.

12. The oscillator of claim 11, further comprising:
a state machine including an input to receive a mode select signal, and including outputs to generate the first and second enable signals.

13. The oscillator of claim 12, wherein:
during a low power mode, the state machine is to enable a first predetermined number of the charging circuits and to adjust the number of enabled capacitor circuits to alter the frequency of the oscillation signal; and
during a low noise mode, the state machine is to enable a second predetermined number of the capacitor circuits and to adjust the number of enabled charging circuits to alter the frequency of the oscillation signal.

14. The oscillator of claim 1, wherein the first delay element comprises:
a pull-down circuit coupled between a first node and a ground potential, the pull-down circuit responsive in part to the first start signal;
a capacitor coupled between the first node and a direct current (DC) potential, the capacitor responsive to a discharge current provided by the pull-down circuit; and
an inverter, coupled between the first node and an output node, to generate the reset signal.

15. The oscillator of claim 2, wherein the DC potential is the ground potential.

16. A system including an oscillator for generating an oscillation signal, the oscillator comprising:
a latch including a first input, a second input, a first output, and a second output;
a first delay element coupled between the first output and the first input of the latch; and
a second delay element coupled between the second output and the second input of the latch, wherein a respective one of the delay elements comprises:
a plurality of charging circuits coupled between a supply voltage and a first node, wherein a number of the charging circuits are selectively enabled in response to one or more first enable signals; and
a plurality capacitor circuits coupled between the first node and a direct current (DC) potential, wherein a number of the capacitor circuits are selectively enabled in response to one or more second enable signals.

17. The system of claim 16, further comprising:
a state machine including an input to receive a mode select signal and including an output to generate the first and second enable signals, wherein the state machine is to control a frequency of the oscillation signal by adjusting a number of enabled charging circuits and adjusting a number of enabled capacitor circuits.

18. The system of claim 16, wherein the DC potential is a ground potential.

19. A system including an oscillator for generating an oscillation signal, the oscillator comprising:
a latch including a first input, a second input, a first output, and a second output;
a first delay element coupled between the first output and the first input of the latch, wherein the first delay element includes a number of selectively enabled first charging circuits and a number of selectively enabled first capacitor circuits; and
a second delay element coupled between the second output and the second input of the latch, wherein the second delay element includes a number of selectively enabled second charging circuits and a number of selectively enabled second capacitor circuits.

20. The system of claim 19, wherein the first and second charging circuits are responsive to a number of corresponding first enable signals, and the first and second capacitor circuits are responsive to a number of corresponding second enable signals.

21. The system of claim 20, further comprising:
a state machine including an input to receive a mode select signal, and including outputs to generate the first and second enable signals.

22. The system of claim 21, wherein the state machine is to adjust a frequency of the oscillation signal by selectively adjusting charging currents provided by the first and second charging circuits and by selectively adjusting charging capacitances provided by the first and second capacitor circuits.

23. The system of claim 20, wherein at least one of the charging circuits comprises:
first and second PMOS transistors coupled in series between a supply voltage and a first node, wherein the first PMOS transistor includes a gate to selectively receive a start signal in response to the corresponding first enable signal, and wherein the second PMOS transistor includes a gate to receive a control voltage.

24. The system of claim 23, wherein the start signal is generated by at least one of the first output and the second output of the latch.

25. The system of claim 20, wherein at least one of the capacitor circuits comprises:
a capacitive element and a switch coupled in series between a first node and a direct current (DC) potential, wherein the switch includes a gate responsive to the corresponding second enable signal.

26. The system of claim 23, wherein the at least one of the capacitor circuits comprises:

a bypass coupled between the first node and a ground potential, and including a gate responsive to a logical combination of the start signal and the corresponding second enable signal.

27. The system of claim 25, wherein the DC potential is a ground potential.

28. A method of generating an oscillation signal using an oscillator including a latch, a first delay element, and a second delay element, the method comprising:
   asserting a reset signal of the latch to logic high by propagating a logic high state of a first start signal through the first delay element after a first delay period, wherein the first delay period is proportional, at least in part, to a first control voltage;
   maintaining a set signal of the latch in a logic low state by propagating a logic low state of a second start signal through the second delay element;
   resetting the first start signal to logic low and the second start signal to logic high in response to assertion of the reset signal;
   asserting a set signal of the latch to logic high by propagating the logic high state of the second start signal through the second delay element after a second delay period, wherein the second delay period is proportional, at least in part, to a second control voltage;
   setting the first start signal to logic high and the second start signal to logic low in response to assertion of the set signal; and
   de-asserting the set signal to logic low in response to the logic low state of the second start signal.

29. The method of claim 28, wherein the first control voltage and second control voltage control a first charging current and a second charging current, respectively.

* * * * *